United States Patent [19]
Alhorn et al.

[11] Patent Number: 5,451,945
[45] Date of Patent: Sep. 19, 1995

[54] MULTI-SPEED MULTI-PHASE RESOLVER CONVERTER

[75] Inventors: Dean C. Alhorn, Huntsville; David E. Howard, Hazel Green, both of Ala.

[73] Assignee: The United States of America as represented by the Administrator, National Aeronautics and Space Administration, Washington, D.C.

[21] Appl. No.: 199,924

[22] Filed: Feb. 22, 1994

[51] Int. Cl.⁶ ............................................. G05B 1/06
[52] U.S. Cl. .................................... 341/110; 318/661; 341/117
[58] Field of Search .................... 341/110, 116, 117; 318/254, 661; 388/811, 812, 814

[56] References Cited

U.S. PATENT DOCUMENTS

| | | | |
|---|---|---|---|
| 3,976,869 | 8/1976 | Stella et al. | 235/189 |
| 4,204,257 | 5/1980 | Hungerford | 364/474 |
| 4,490,661 | 12/1984 | Brown et al. | 318/661 |
| 4,651,068 | 3/1987 | Meshkat-Razavi | 318/254 |
| 4,703,307 | 10/1987 | James et al. | 341/117 |
| 4,855,744 | 8/1989 | Sayers | 341/116 |
| 5,173,696 | 12/1992 | Howard et al. | 341/117 |
| 5,189,353 | 2/1993 | Ezuka | 318/605 |
| 5,204,604 | 4/1993 | Radun | 318/701 |

*Primary Examiner*—Marc S. Hoff
*Attorney, Agent, or Firm*—Robert L. Broad, Jr.; Guy M. Miller; Alan J. Kennedy

[57] ABSTRACT

A multiphase converter circuit generates a plurality of sinusoidal outputs of displaced phase and given speed value from the output of an angular resolver system attachable to a motor excited by these multi-phase outputs, the resolver system having a lower speed value than that of the motor. The angular resolver system provides in parallel format sequential digital numbers indicative of the amount of rotation of the shaft of an angular position sensor associated with the angular resolver system. These numbers are used to excite simultaneously identical addresses of a plurality of addressable memory systems, each memory system having stored therein at sequential addresses sequential values of a sinusoidal wavetrain of a given number of sinusoids. The stored wavetrain values represent sinusoids displaced from each other in phase according to the number of output phases desired. A digital-to-analog converter associated with each memory system converts each accessed word to a corresponding analog value to generate attendant to rotation of the angular resolver a sinusoidal wave of proper phase at each of the plurality of outputs. By properly orienting the angular resolver system with respect to the rotor of the motor, essentially ripple-free torque is supplied to the rotor. The angular resolver system may employ an analog resolver feeding an integrated circuit resolver-to-digital converter to produce the requisite digital values serving as addresses. Alternative versions employing incremental or absolute encoders are also described.

18 Claims, 6 Drawing Sheets

MULTI-SPEED MULTI-PHASE RESOLVER CONVERTER

ORIGIN OF THE INVENTION

This invention was made by employees of the United States Government and may be manufactured and used by or for the government for governmental purposes without the payment of any royalties.

BACKGROUND OF THE INVENTION

1. Field of the Invention

The field of the invention is the electrical motor art, and in particular means for supplying multi-phase excitation to poly-phase brushless motors.

2. Description of Related Art

This invention originated from a need to develop an inexpensive brushless direct current motor controller for a space station experiment pointing system. A brushless D.C. motor can be commutated using several different methods. The first method, six-step commutation, causes an undesirable torque ripple in the pointing system, while the second method, sinusoidal commutation, does not. Because the torque ripple would cause an undesirable jitter in the pointing control, sinusoidal commutation is preferred. Problems arise when the number of poles becomes excessive, as for example with a 48 pole, 3-phase brushless D.C. motor. The back electromotive force (EMF) of a permanent magnet brushless motor will cycle sinusoidally, and the number of cycles is equal to one-half the number of poles per mechanical revolution of the motor. To minimize the torque ripple, the current applied to the motor must be in phase with the motor back EMF. (For a complete description of the four quadrant control of a brushless 3-phase motor, see U.S. Pat. No. 4,644,234.) As shown in the brushless commutation literature, if the current and back EMF are in phase, then the following relationship for torque is valid:

$$T = [\sin^2(\Theta) + \sin^2(\Theta + 2\pi/3) + \sin^2(\Theta + 4\pi/3)] \cdot K_m \cdot I = 1.5 \cdot K_m \cdot I$$

where

T = total motor torque;
$K_m$ = torque constant of the motor;
I = motor current; and
$\Theta$ = angle of rotor magnets with respect to the stator windings To generate the sinusoidally varying current, an angular position sensor which has the same frequency and is in phase with the motor back EMF has traditionally been required. The previous method for converting sinusoidal commutations of multi-pole D.C. brushless motors was to employ a multi-speed resolver. For the motor selected, a 48-pole (24-speed) unit, a 3-phase resolver would be required to perform the commutation. This type of resolver is commercially available, but not as an off-the-shelf item. To custom manufacture one would be prohibitively expensive and time consuming, and would have undesirable size and weight factors for space applications. There is a need for an inexpensive solution to this problem. This invention is directed to a solution of these and related problems.

SUMMARY OF THE INVENTION

A multi-phase digital converter circuit for use with an angular resolver system is disclosed, the angular resolver system providing in parallel format on a plurality of resolver system output terminals a digital signal indicative of the angular position of an angular position sensor. In one form of the invention, the angular resolver system includes a single speed 2-phase analog resolver having its analog output connected to drive a resolver-to-digital converter circuit. The resolver-to-digital converter circuit in turn produces in parallel format on a plurality of output terminals the above mentioned digital signals. The digital multi-phase converter circuit includes a plurality of addressable digital memory systems, each system having address and data terminals and having stored therein at sequential addresses sequential values of a wave train of sinusoids of given number common to all of the memory systems. The wave train values in each memory system represent a sinusoidal wave train; however, the sinusoidal wave trains and the values corresponding thereto are displaced in phase with respect to the wave trains associated with each of the remaining memory systems. Each memory system is connected at its address terminals to receive simultaneously the digital signals produced by the angular resolver system. Simultaneous sequential addressing of the memory systems will cause sequential values of the stored sinusoidal wave trains to be outputted at memory system output terminals. A digital-to-analog converter is connected to the output of each of the memory system output terminals and converts the wave train values received into analog form to be presented at converter circuit output terminals.

In one form of the invention, as applied to producing 3-phase output to excite a 24-speed (48-pole) motor, the sequentially stored values in each of the memory systems represent incremental values along a sinusoidal wave train having 24 sinusoids each. The number of memory systems is 3, and the 3 sets of wave trains are displaced from each other by 120 degrees. A modification of the memory systems and the phase displacement between the stored wave trains may be carried out to provide for proper excitation of a multi-speed 2-phase motor.

Alternative input systems for providing digital position-indicating signals on the address lines of the memory systems include an absolute optical encoder for producing direct digital representations of the angular position of its associated shaft, and a multi-pulse incremental encoder for producing sequential pulses as the encoder rotation increases, the pulses being conveyed to a counter to be converted to a digital representation at the counter output.

Other advantages and features of invention will become apparent upon making reference to the specifications, claims and drawings to follow.

DESCRIPTION OF THE PREFERRED EMBODIMENTS

Figure 1:
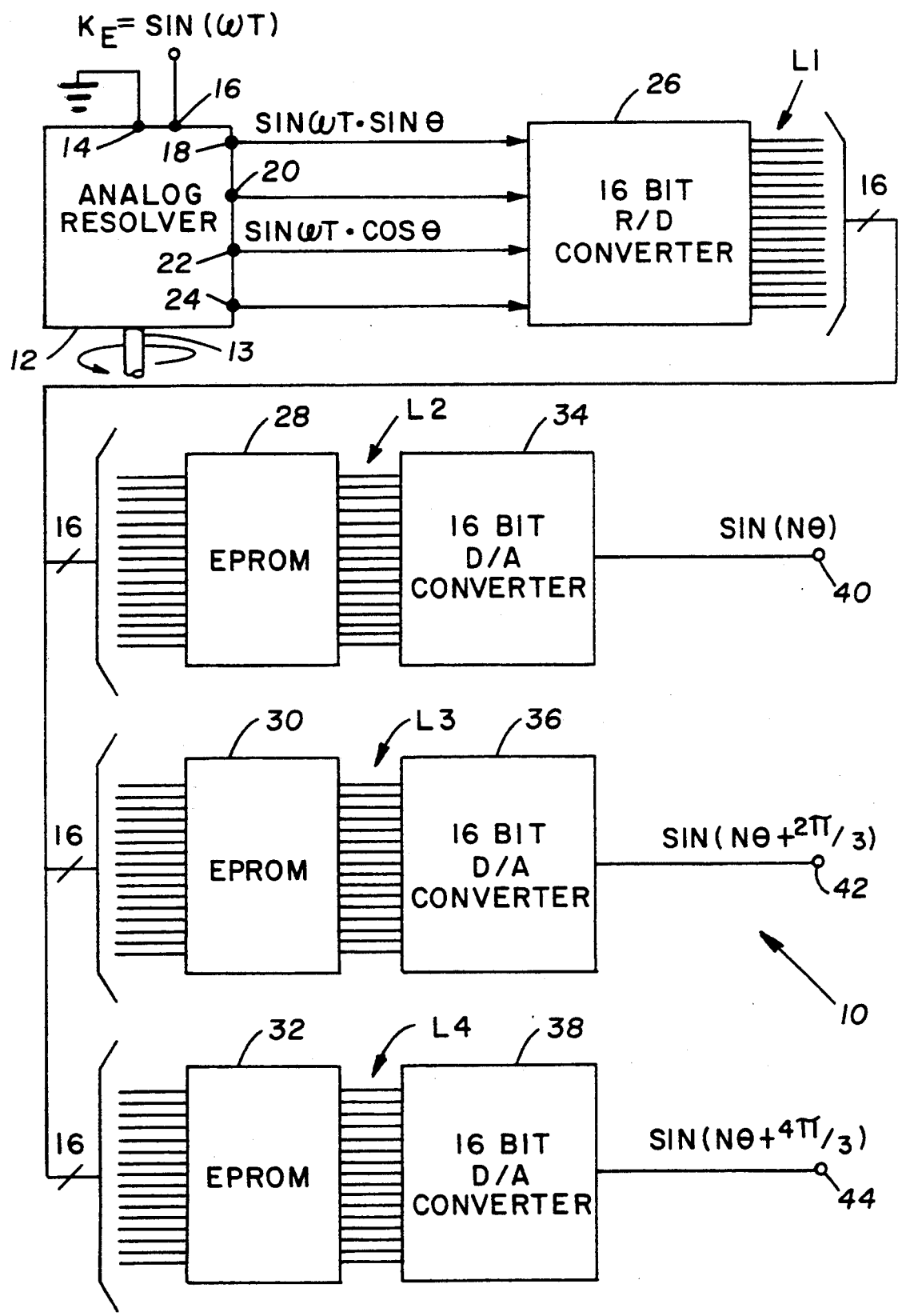
FIG. 1 is a block diagram of a multi-phase converter circuit designed to produce 3-phase output from digital signals provided by an analog angular resolver feeding a resolver-to-digital converter.

While this invention is susceptible of embodiment in many different forms, there is shown in the drawings and will herein be described in detail a preferred embodiment of the invention with the understanding that the present disclosure is to be considered as an exemplification of the principles of the invention, and is not intended to limit the broad aspect of the invention to the embodiments illustrated.

The present invention is mainly concerned with a multi-phase converter for producing from low-speed angular resolvers multi-phase excitation signals for driving multi-phase brushless motors of speed value higher than that of the resolver system. A multi-phase converter circuit is designed for use with an angular resolver system, the angular resolver system providing in parallel format on a plurality of resolver system output terminals a digital signal indicative of the angular position of an angular resolver. In the preferred form of the invention, the angular resolver system includes a single speed (speed value 1) 2-phase analog resolver having its output connected to drive a resolver-to-digital converter. The digital converter in turn produces in parallel format on a plurality of output terminals the above mentioned digital signals. The multi-phase converter circuit includes a plurality of addressable digital memory systems, each system having address and data terminals and having stored therein at sequential addresses sequential values of a wave train of sinusoids of given number common to all of the memory systems. The wave train values in each of the memory systems represent a sinusoidal wave train; however, the sinusoidal wave trains and the values corresponding thereto are displaced in phase with respect to the wave trains associated with each of the remaining memory systems. The memory systems are configured as table look-up systems. Each memory system is connected at its address terminals to receive simultaneously digital signals produced by the angular resolver system, in the preferred embodiment from an analog resolver-to-digital converter system. Simultaneous sequential addressing of the memory systems will cause the values of these stored sinusoidal wave trains to be outputted at system memory output terminals in parallel format. A digital-to-analog converter is connected to the output of each of the memory systems and converts the wave train values received into analog form to be presented at system output terminals.

In more detail, FIG. 1 shows a block diagram for a single speed 2-phase to 24 speed 3-phase resolver converter. An analog resolver 12 is excited by a sinusoidal signal, $K_E \cdot \sin(\omega t)$ applied to terminals 14, 16, resulting in the conventional modulated sine and cosine analog outputs $K_R \cdot \sin(\omega t) \cdot \sin(\Theta)$ and $K_R \cdot \sin(\omega t) \cdot \cos(\Theta)$ at terminals 18, 20 and 22, 24 respectively, where $K_R$ is a constant, $\omega$ is the excitation frequency, and $\Theta$ is the angle of resolver shaft 13. Typical excitation values are 5 volts at 5 kilohertz. These outputs are the inputs to a resolver-to-digital (R/D) converter 26. The R/D converter 26 takes the signals and produces on lines L1 a 16-bit digital word corresponding to the angle of the resolver shaft 13.

Lines L1 communicate these words to a digital multiphase converter circuit 10. The 16-bit word is used to address each of three 64K programmable memory IC (EPROM) systems 28, 30, The particular analog resolver 12 is a model 25R77G-71A made by American Electronics, Inc. of Culver City, Calif. Zero rotation of the resolver shaft 13 from a fiducial point results in a numerical output of 0000(H) on lines L1. Successive incremental rotation of the shaft 13 causes the output numbers to monotonically increase to a final terminal value of FFFF(H) at the completion of one revolution.

The first EPROM system 28 contains the digitized amplitudes of 24 sinusoidal waves in 64K increments. The second EPROM system 30 has the 24 sinusoidal values shifted $2\pi/3$ radians (120°), and the final EPROM system 32 contains the sine wave data shifted $4\pi/3$ radians (240°). The data stored in each EPROM system 28, 30, 32, is thus in the form of 64K 16-bit words, resulting in sinusoidal information which has a peak-to-peak accuracy of 16-bits and a 16-bit accuracy over 360 mechanical degrees i.e. 24 sinusoidal waves.

To avoid the necessity for employing a sign bit to accommodate negative values of the stored sinusoidal wave forms, and thereby to secure maximum utilization of memory capacity, the sequential values of the sinusoidal wave forms stored digitally in the EPROM systems 28, 30, 32 are stored in the form $1 + \sin(24 \cdot \Theta + \Phi)$, where $\Phi$ is the phase angle associated which each memory unit, e.g. $2\pi/3$, $4\pi/3$.

Each of these EPROM systems 28, 30, 32 feeds via lines L2, L3, L4 respectively associated 16-bit digital-to-analog converters 34, 36, 38 (DAC) which convert the signal values stored in the EPROM systems 28, 30, 32 to analog values. The digital-to-analog converters 34, 36, 38 are type MM3292 bipolar units made by Micro-Networks of Worcester, Mass. Their biasing is arranged so that in response to an input number 0000 an analog output voltage of +10 volts is produced, in response to a digital input FFFF(H) an analog voltage of −10 is produced, and a half-range value corresponding to the axis crossings of an unbiased sinusoidal wave train, namely an input number 7FFF gives rise to 0 volts at the output. This generates the 3-phase sinusoidal signals appearing at terminals 40, 42, and 44, each containing 24 cycles for one revolution of the resolver shaft 13.

Figure 2A:
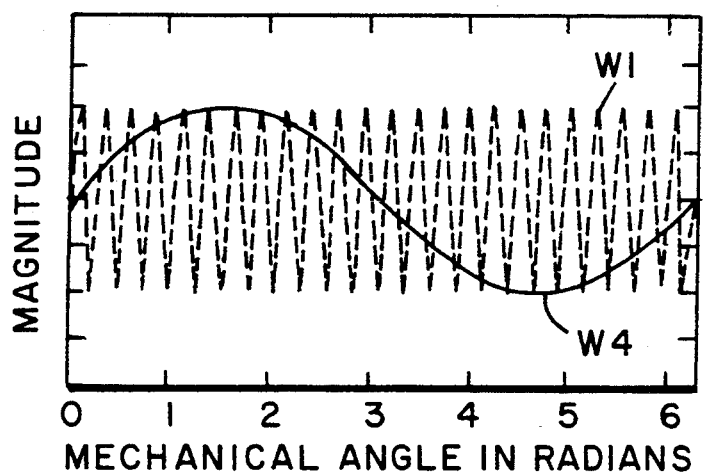
FIG. 2A shows the relationship between one resolver phase and a 28 cycle sinusoidal wave form generated by conversion of the resolver output signal.

FIG. 2A shows the demodulated output of one resolver phase (curve W4) in synchronism with the generated 24 sinusoid wave train (curve W1). The signals appearing at terminals 40, 42, 44 serve to provide properly phased sinusoidal excitation for a 48-pole brushless D.C. motor through appropriate drivers (not shown). These signals are in synchronism with the sine and cosine waveforms of the single speed resolver 12, thus electronically producing the desired multiple speed resolver outputs from a single speed device.

Figure 2B:
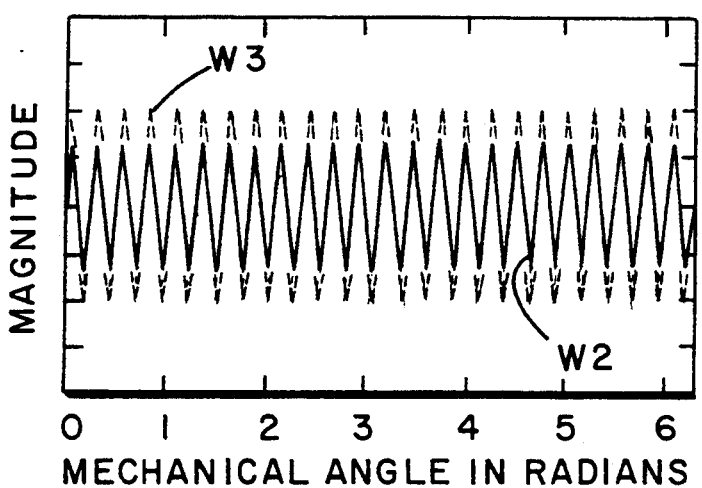
FIG. 2B shows the relationship of motor back EMF and one phase of motor current when the resolver of FIG. 1 is connected to drive a motor, and the resolver is properly oriented with respect the motor shaft.

Once the above described electronic system is set up, the resolver 12 can then be mechanically coupled to the shaft of the driven motor (not shown). By monitoring, for example, output terminal 40 and one phase of the motor, the resolver can be mechanically adjusted so that the resolver signals (curve W2 in FIG. 2B) are in phase with the motor back EMF (curve W3), thereby aligning the 3-phase sinusoidal signals with the 3-phase motor back EMF to provide excitation giving rise to low torque ripple.

FIGS. 3A-3D show a schematic diagram of a circuit for accomplishing the previously stated objectives. The functioning of this circuit will be evident to those of ordinary skill in the art. Resolver field excitation is provided by a sinewave generator U4 having its output passed through driver U5 and a final driver U7. Reference sinusoidal excitation is derived from driver U5 and driver U6. The two resolver outputs are delivered to terminals 4 and 7 of a resolver-to-digital-converter integrated circuit U3, preferably type AD2S80 made by Analog Devices, Inc. of Norwood, Mass. Terminals 9-24 feed the address line groups previously designated as L1, and this address line group feeds in parallel the address terminals of memory elements M1, M2, M3, M4, M5, M6. Each of the memory elements M1, M2, M3, M4, M5, M6 is a 64K i.e. 10000(H) memory element having storage capacity for 8-bit words. The memory elements M1-M6 are wired to provide high-byte/low-byte outputs. Thus, the paired arrangement consisting of memory elements M1 and M2 have the eights bits representing the most significant bits (high bits) of each word stored in element M2, and the corresponding least significant bits stored in element M1. Similar considerations apply to the storage of waveform information in M3, M4, M5 and M6 The eight data output lines of element M2 extending from pins 11 to 19 are fed to the most significant bit pins 1-8 of a digital-to-analog converter U11, and the data lines from terminals 11 to 19 of element M1 are connected to the lower bit value terminals of converter U11. Collectively, these two groups of 8 lines correspond to line L2 of FIG. 1. Digital-to-analog converters U12 and U13 are similarly connected to the memory element pairs M3, M4 and M5, M6 to produce the desired 3-phase sinusoidal excitation at output terminals 40, 42, 44.

The single speed 2-phase to 24-speed 3-phase converter described above may easily be modified for use with 2-phase motors by eliminating one EPROM block and its associated digital-to-analog converter and by shifting the sinusoidal waveform data stored in memory units M3, M4 by $\pi/2(90°)$ from the waveform data in memory elements M1, M2.

Figure 4:
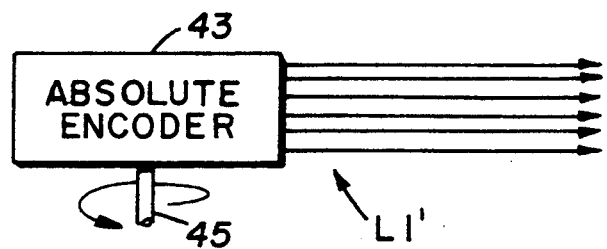
FIG. 4 shows the use of an absolute encoder to supply digital data to he converter shown in FIG. 1.
Figure 5:
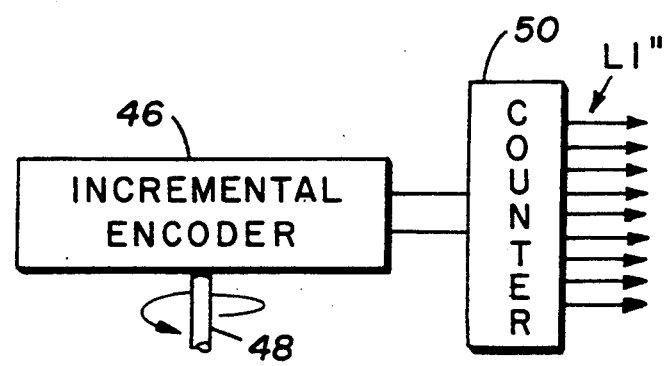
FIG. 5 shows the use of an incremental encoder and a digital counter to provide digital data to the circuit shown in FIG. 1.
Figure 3A:
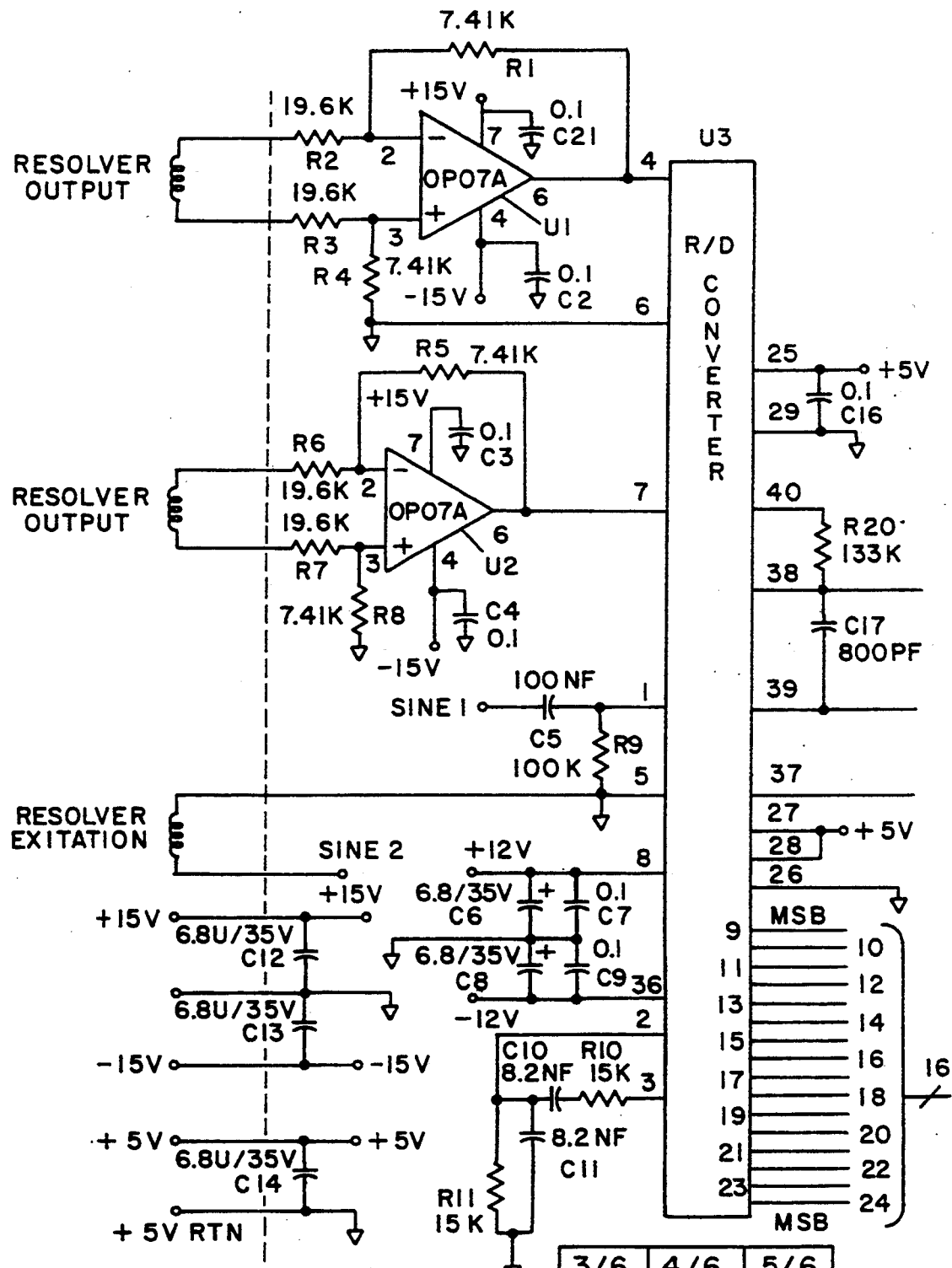
FIGS. 3A-3D show a schematic circuit performing the functions indicated in FIG. 1.
Figure 3B:
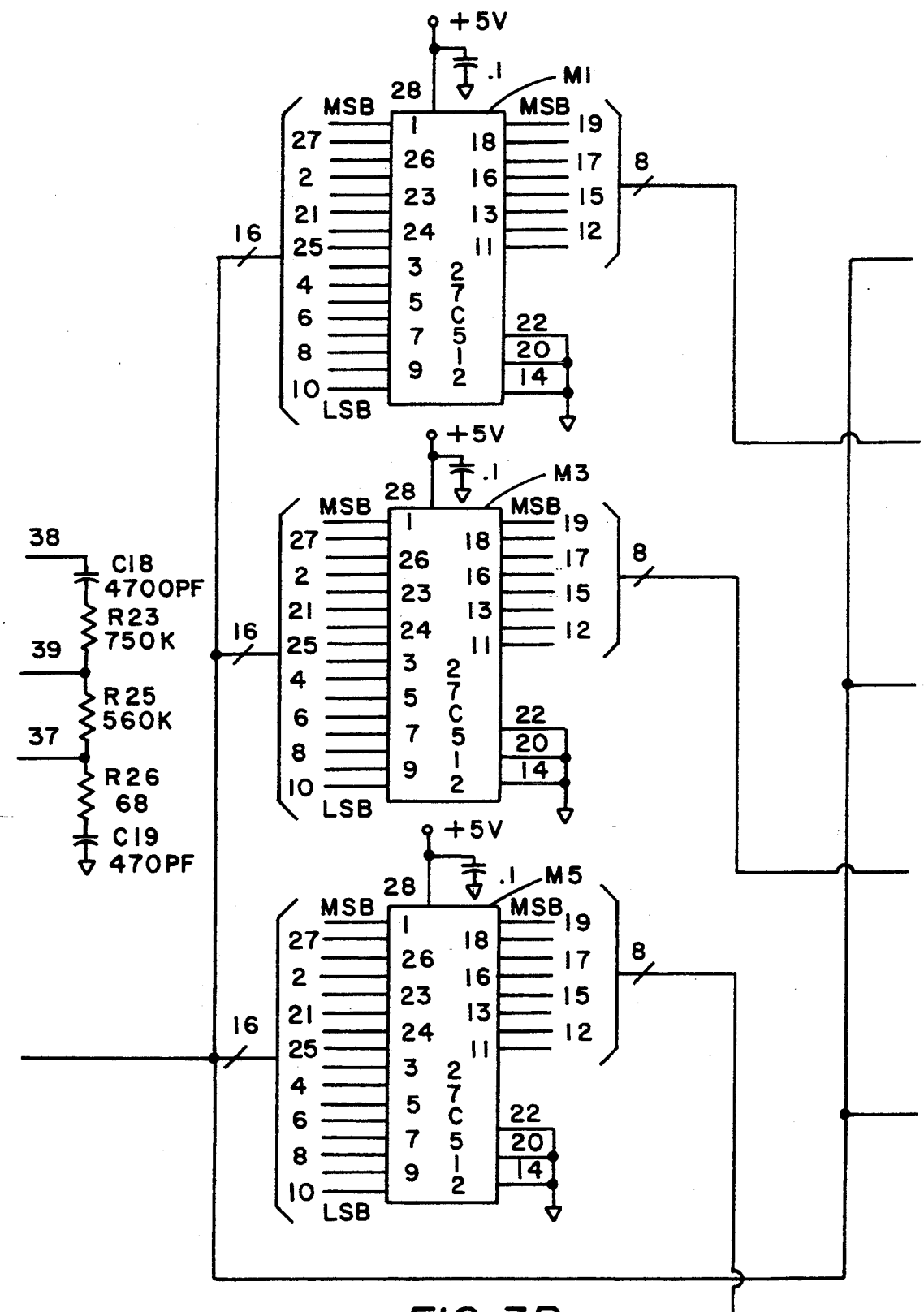
Figure 3C:
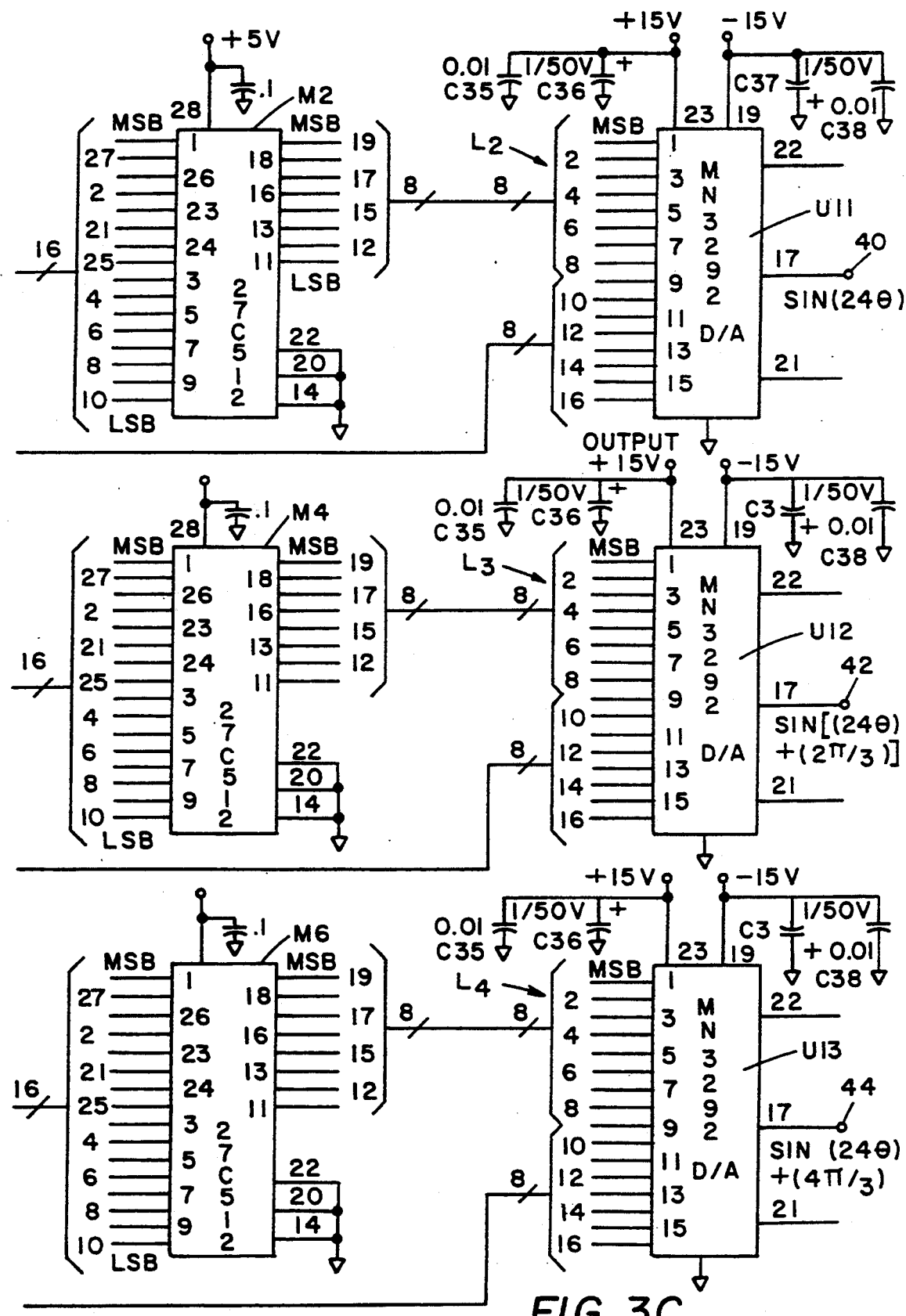
Figure 3D:
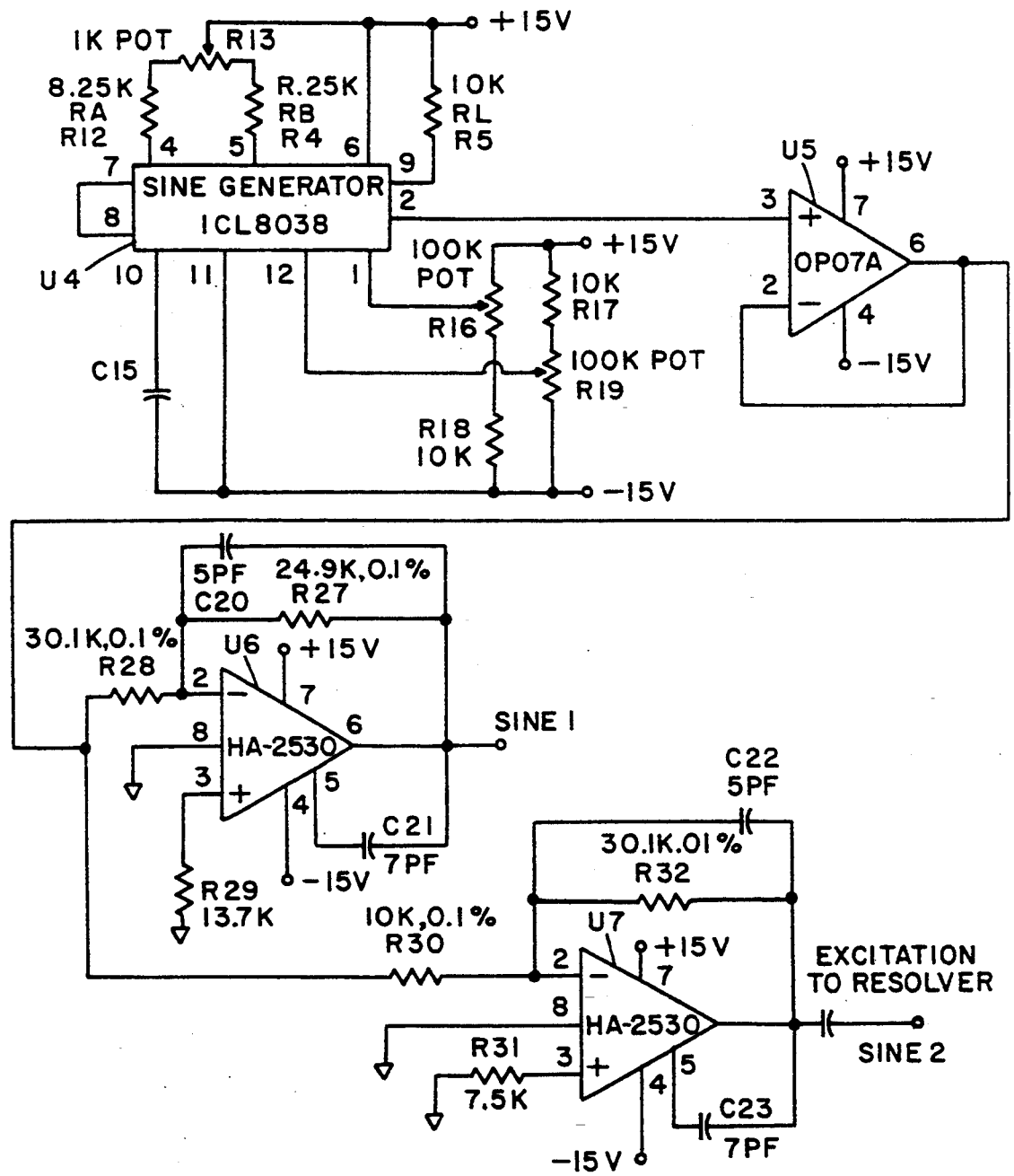

The previous discussion has centered on the use of an analog type angular resolver producing modulated analog output signals. Other types of angular resolver systems may be employed. Thus, for example, as shown in FIG. 4, an absolute encoder 43 such as an absolute optical encoder driven by a shaft 45 may be used to place digital values on lines L1' to provide digital inputs to the memory systems 28, 30, 32 of FIG. 1. Alternatively, an incremental encoder unit 46 driven by a shaft 48 and producing an output pulse for each given increment of rotation may be used to drive a counter 50, the count appearing on output lines L1". Because of the limited range of values available from either of the foregoing encoders 43, 46, a corresponding reduction or increase in the number of output lines L1, L1" is possible. This in turn will allow a reduction or increase in the necessary capacity of the memory systems 28, 30, 32 and a corresponding reduction or increase in the number of lines in groups L2, L3, L4. The previously described versions employing an analog resolver-to-digital converter, an absolute encoder system, and an incremental encoder system, are all to be construed as being "angular resolver systems" in the sense of the claims. Moreover, the angular resolver 12, the absolute encoder 43, and the incremental encoder unit 46 are all to be construed as the being "angular position sensors".

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the inventions not be limited to a particular embodiment disclosed as the best mode contemplated for carrying out the invention, but that the invention will include all embodiments falling within the scope of the appended claims. In particular, although attention is focused solely on the use of single speed angular resolvers, it is clear that resolvers of higher speed value may have their outputs converted to still higher speed values by the multi-sine wavetrain storage method outlined hereinabove.

We claim:

1. A multiphase converter for use with an angular resolver system including an angular position sensor and providing in parallel format on a plurality of resolver system output terminals a digital number-indicating signal in the form of a number indicative of the angular position of said angular position sensor comprising:
   a plurality of addressable digital memory systems, each said memory system having address and data output terminals and having stored therein at sequential addresses sequential values of a wave train of sinusoids of given number common to all of said memory systems, the wave train values in each said memory system representing a sinusoidal wave train displaced in phase with respect to the phases of the wave trains associated with the remainder of said memory systems;
   a plurality of data input lines connected in parallel to said address terminals of said memory systems so that said memory systems are simultaneously addressed by digital number-indicating signals applied to said data input lines;
   an output line associated with each said memory system; and
   a digital-to-analog converter associated with each said memory system having parallel input terminals connected to said data terminals of said associated memory system and an output terminal, the output terminals of each said digital-to-analog converter being connected to a different one of said output lines, each said digital-to-analog converter being configured and connected to produce analog output signals of constant peak amplitude irrespective of the rate of addressing by said digital number-indicating signals applied to said data input lines.

2. The multiphase converter of claim 1 further including an analog resolver-to-digital converter circuit having a plurality of analog input terminals for accepting analog rotation-indicating signals from an analog angular resolver and a plurality of resolver-to-digital converter circuit output terminals connected to said data input lines.

3. The multiphase converter of claim 2 wherein said resolver-to-digital converter circuit includes at least 16 of said resolver-to-digital converter circuit output terminals and providing at said resolver-to-digital converter output terminals digital numerical values ranging from 0000 to at least FFFF(H), each said memory system having at least 16 of said address terminals and 16 of said data output terminals, each said memory system having a memory capacity of at least 10000(H) words of at least 16 bits, each of said digital-to-analog converters having at least 16 input terminals for accepting digital data values up to at least FFFF(H).

4. The multiphase converter of claim 1 wherein the number of said memory systems is two and the wave train values stored therein represent sinusoidal wave trains displaced in phase by 90 degrees with respect to each other.

5. The multiphase converter of claim 1 wherein the number of said memory systems is three and the wave train values stored therein represent sinusoidal wave trains displaced in phase by 120 degrees with respect to each other.

6. The multiphase converter of claims 1, 4 or 5 wherein each said memory system has at least 16 of said address terminals and 16 of said data output terminals, each said memory system has a memory capacity of at least 10000(H) words of at least 16 bits, each of said digit converters has at least 16 input terminals for accepting digital data values up to at least FFFF(H).

7. A multiphase converter system comprising:
an angular resolver system having a plurality of resolver system output terminals and an angular position sensor, said angular resolver system including means for providing in parallel format on said angular resolver system output terminals a digital number-indicating signal in the form of a number indicative of the angular position of said angular position sensor;
a plurality of addressable digital memory systems, each said memory system having address and data output terminals and having stored therein at sequential addresses sequential values of a wave train of sinusoids of given number common to all of said memory systems, the wave train values in each said memory system representing a sinusoidal wave train displaced in phase with respect to the phase of the wave trains associated with the remainder of said memory systems,
a plurality of data input lines connected in parallel between said resolver system output terminals and said address terminals of said memory systems so that said memory systems are simultaneously addressed by said digital number-indicating signals;
an output line associated with each said memory system; and
a digital-to-analog converter associated with each said memory system having parallel input terminals connected to said data output terminals of said associated memory system and an output terminal, the output terminals of each said converter being connected to a different one of said output lines, each said digital-to-analog converter being configured and connected to produce analog output signals of constant peak amplitude irrespective of the rate of addressing by said digital number-indicating signals applied to said data input lines.

8. The multiphase converter system of claim 7 wherein the number of said memory systems is two and the wave train values stored therein represent sinusoidal wave trains displaced in phase by 90 degrees with respect to each other.

9. The multiphase converter system of claim 7 wherein the number of said memory systems is three and the wave train values stored therein represent sinusoidal wave trains displaced in phase by 120 degrees with respect to each other.

10. The multiphase converter system of claim 7 wherein said angular resolver system includes an analog angular resolver of given speed value having a plurality of analog resolver output terminals and being configured to produce at said resolver output terminals analog rotation-indicating signals, and an analog resolver-to-digital converter circuit having a plurality of analog input terminals connected to said analog resolver output terminals and a plurality of resolver-to digital converter circuit output terminals connected to said data input lines, said given common number being greater than said speed value.

11. The multiphase converter system of claim 10 wherein the value of said given speed value is 2 and the value of said given number of sinusoids is 24.

12. The multiphase converter system of claim 7 wherein said resolver-to-digital converter circuit includes at least 16 of said resolver-to-digital converter output terminals and provides at said resolver-to-digital converter output terminals digital numerical values ranging from 0000 to at least FFFF(H).

13. The angular resolver system of claims 8,9 or 12 wherein each said memory system has at least 16 address and data output terminals, each said memory system has a memory capacity of at least 10000(H) words of at least 16 bits, each of said digital-to-analog converters has at least 16 input terminals for accepting digital data values up to at least FFFF(H).

14. The multiphase converter system of claim 7 wherein said angular resolver system includes a rotary absolute encoder having a plurality of encoder output terminals and configured to provide at said encoder output terminals in parallel format digital numbers indicative of the amount of rotation of said absolute encoder, said encoder output terminals being connected to said data input lines.

15. The multiphase converter system of claim 7 wherein said angular resolver system includes a rotary incremental encoder producing a given number of pulses per turn and a counter connected to count and store the number of said pulses, said counter having a plurality of output terminals connected to said data input lines.

16. A method for providing multiphase excitation for multiphase motors from an angular resolver system including an angular position sensor and providing in parallel format on a plurality of resolver system output terminals a digital number-indicating signal in the form of a number indicative of the angular position of said angular position sensor comprising the steps of:
exciting a plurality of addressable digital memory systems, each said memory system having address and data output terminals and having stored therein at sequential addresses sequential values of a wave train of sinusoids of given number common to all of said memory systems, the wave train values in each said memory system representing a sinusoidal wave train displaced in phase with respect to the phases of the wave trains associated with the remainder of said memory systems, said number-indicating signals being applied simultaneously to said address terminals; and converting the digital signals appearing at said data output terminals of each said memory system to an equivalent analog voltage value in such a way that each said analog voltage value has a constant peak amplitude value irrespective of the rate of addressing by said digital number-indicating signals applied to said data input lines.

17. The method of claim 16 for use with an angular resolver system having an analog angular resolver as said angular position sensor and providing analog signals indicative of the angular position of said analog angular resolver, said method further comprising the step of converting said analog signals to said digital number-indicating signals by means of a resolver-to-digital converter circuit.

18. The method of claim 16 for use with an angular resolver system having a rotary incremental encoder as said angular position sensor and producing a given number of pulses per turn, said method further comprising the step of converting the number of said pulses to said digital number-indicating signals by means of a binary counter.

* * * * *